United States Patent [19]

Kemppainen

[11] Patent Number: 4,609,242

[45] Date of Patent: Sep. 2, 1986

[54] ELECTRICAL CONNECTOR APPARATUS

[75] Inventor: Nels E. Kemppainen, Bloomington, Minn.

[73] Assignee: ADC Telecommunications, Inc., Minneapolis, Minn.

[21] Appl. No.: 669,092

[22] Filed: Nov. 6, 1984

[51] Int. Cl.⁴ .............................................. H05K 1/00

[52] U.S. Cl. ................................ 339/17 LC; 29/882; 339/217 R; 339/220 R; 339/177 R; 339/258 R; 339/182 R; 339/126 J

[58] Field of Search ................ 339/17 C, 17 LC, 220, 339/221, 276 R, 177 R, 177 E, 218; 29/881, 884, 882

[56] References Cited

U.S. PATENT DOCUMENTS

| | | | |
|---|---|---|---|
| 1,984,036 | 12/1934 | Schwartzmann | 339/218 M |
| 2,691,770 | 10/1954 | Jonaitis | 339/183 |
| 3,206,540 | 9/1965 | Cohen | 339/177 R |
| 3,253,250 | 5/1966 | Harrison | 339/177 R |
| 3,335,388 | 8/1967 | Karol | 339/18 |
| 3,403,369 | 9/1968 | Steiff et al. | 339/221 R |
| 3,453,376 | 7/1969 | Ziegler, Jr. | 339/177 R |
| 3,553,632 | 1/1971 | Hildebrand | 339/218 M |
| 3,649,957 | 3/1972 | Baluck | 339/17 LC |
| 3,993,396 | 11/1976 | Eigenbrode | 339/220 R |
| 4,092,058 | 5/1978 | Eigenbrode | 339/218 M |
| 4,193,654 | 3/1980 | Hughes et al. | 339/220 R |
| 4,420,216 | 12/1983 | Motoyama | 339/183 |
| 4,435,031 | 3/1984 | Black et al. | 339/17 LC |

FOREIGN PATENT DOCUMENTS 2024539 1/1980 United Kingdom ........... 339/221 M

OTHER PUBLICATIONS

Photographs of electrical connector made by AMP Incorporated, Harrisburg, PA.

*Primary Examiner*—Gil Weidenfeld
*Assistant Examiner*—David L. Pirlot
*Attorney, Agent, or Firm*—Merchant, Gould, Smith, Edell, Welter & Schmidt

[57] ABSTRACT

The present invention is directed to connector apparatus comprising a jack (20) usable with either a conventional plug (400) terminating a coaxial cable (410) or a special plug (200) terminating a shielded, twisted pair cable (202). Such versatility was made possible by a full body first conductor (68) having spring contactors (130) which may be separated from grounding contact with barrel (36) of housing (32) by an insulator (216) of plug (200) includes a protruding insulator (216) for separating the contactors (130) and functioning the switching mechanism. Plug (200) also includes first and second conductors (212) and (214) for connection with second and first jack conductors (76) and (68), respectively. In addition, unique structures for pieceparts and assembly details resulting in various interlocking arrangements are disclosed with respect to the structure of jack (20) and plug (200).

2 Claims, 13 Drawing Figures

ELECTRICAL CONNECTOR APPARATUS

FIELD OF THE INVENTION

The present invention is directed to the field of electrical connectors and, more particularly, to a jack for mounting on a circuit board and a plug for mating with the jack. The jack may be used to mate with a standard plug attached to standard coaxial cable or with the inventive plug for attachment to shielded, twisted pair cable.

BACKGROUND OF THE INVENTION

Presently, coaxial cable may be terminated with a plug which mates with a jack on a circuit board. This type of plug and jack is usable only with coaxial cable. Other types of connectors for multi-conductor cable are known. Prior to the present invention, however, there has not been a jack which could be used both with coaxial cable and the standard plug and with shielded, twisted pair cable terminated with any known multi-conductor plug.

SUMMARY OF THE INVENTION

The present invention, then, is directed to a new jack and a new plug. The inventive jack includes a housing and a plurality of mechanisms for conducting electrical current. There is supporting means for the conducting mechanisms. The supporting means is attached to the housing and include insulative material between each of the plurality of conducting mechanisms. The jack further includes a mechanism for switching continuity between open and closed between a pair of the conducting mechanisms.

A particularly advantageous feature claimed in the present application and usable on a number of different types of jacks was invented by one of the members of the design team who invented the above-identified jack, which is claimed more generally in another application having the same filing date and the same assignee as the present application. The feature is directed to a mechanism for anchoring the leads of conducting mechanims to the back wall of the supporting means of the jack housing. The anchoring mechanism may be used on jacks having a switching mechanism as indicated above or on jacks not having a switching mechanism.

The inventive plug used for connecting shielded, twisted pair cable to the inventive jack includes a housing and a plurality of mechanisms for conducting electrical current. The plug also includes supporting means attached to the housing. The supporting means includes insulating mechanism for insulating between each of the conducting mechanisms. When the plug is received by the jack, at least a pair of the plug conducting mechanisms make contact with at least a pair of the jack conducting mechanisms.

Of particular importance with respect to the plug is a dielectric member which projects beyond the end of the housing of the plug so that when it is inserted into the barrel of the jack, the dielectric member may function the switching mechanism in the jack to move it from a closed position to an open position while insertion of a standard coaxial connector (without this projection) will not function the switching mechanism.

A subset of the design team which invented the jack and plug including the inventor of the claimed apparatus in this application invented a novel way to interlock a number of the components of the plug. Although disclosed in the present application, the details of the interlocking are claimed in a separate application filed on the same day as the present application and assigned to the same assignee as the present application. Such feature is directed to the insulating mechanism including means for locking the plurality of conducting mechanisms to the housing of the plug.

In addition, the present invention not only resides in the apparatus, but also in the methods for making and using the jack and plug.

Although some of the advantages and objects of the inventive jack and plug hve been herein summarized, further advantages and objects of the inventions are explained hereinafter and may be better understood by reference to the drawings and the descriptive matter which follows. A preferred embodiment of the inventions is illustrated in the drawings and described thereafter.

DETAILED DESCRIPTION OF THE PREFERRED EMBODIMENT

Figure 1:
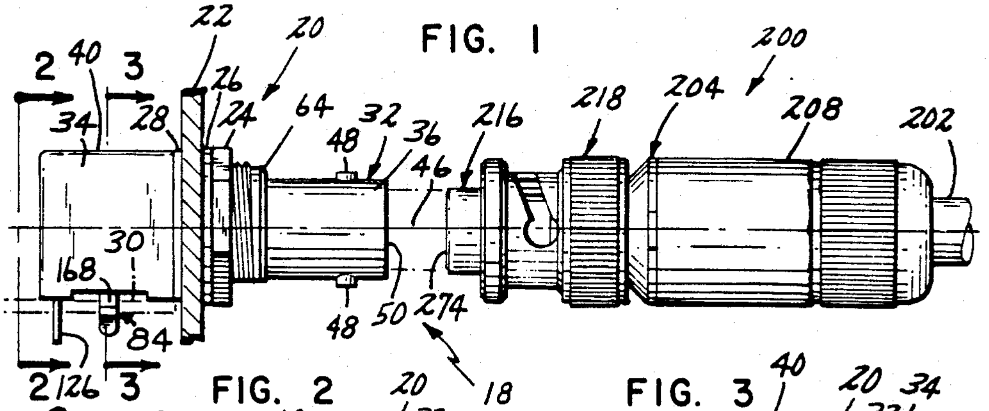
FIG. 1 is a side elevational view of a jack and a plug in accordance with the present invention.

Referring now to the drawings wherein like reference numerals designate identical or corresponding parts throughout the several views, and more particularly to FIG. 1, a jack in accordance with the present invention is designated generally by the numeral 20 and a plug in accordance with the present invention is designated generally by the numeral 200. Jack 20 is shown fastened to a panel 22 with a nut 24 and washers 26 and 28 on either side of panel 22. Jack 20 is also shown as being mounted on a circuit board 30, shown in phantom lines. Plug 200 has a cable 202 attached to it. Plug 200 is spaced from jack 20 in an orientation ready for being received by jack 20. Jack 20 and plug 200 thus provide a connector apparatus 18 for connecting cable 202 to a circuit on circuit board 30 so as to form a connecting relationship as depicted schematically in FIG. 13.

Figure 3:
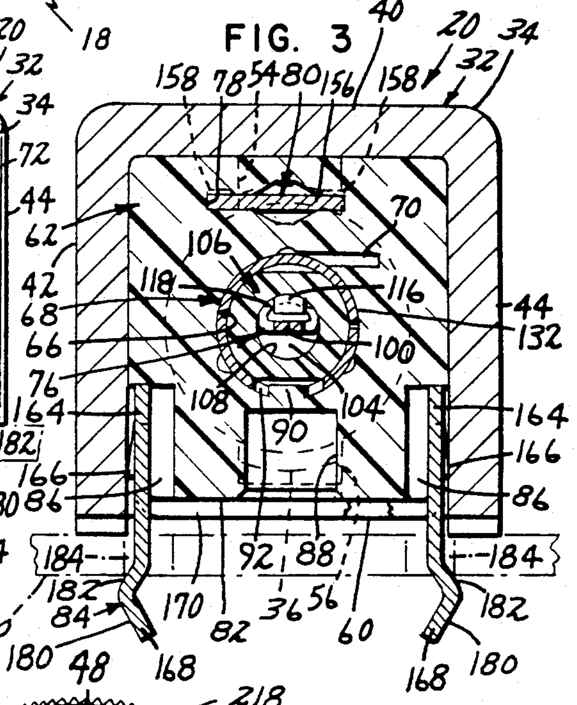
FIG. 3 is a cross-sectional view of the jack taken along line 3—3 of FIG. 1.
Figure 4:
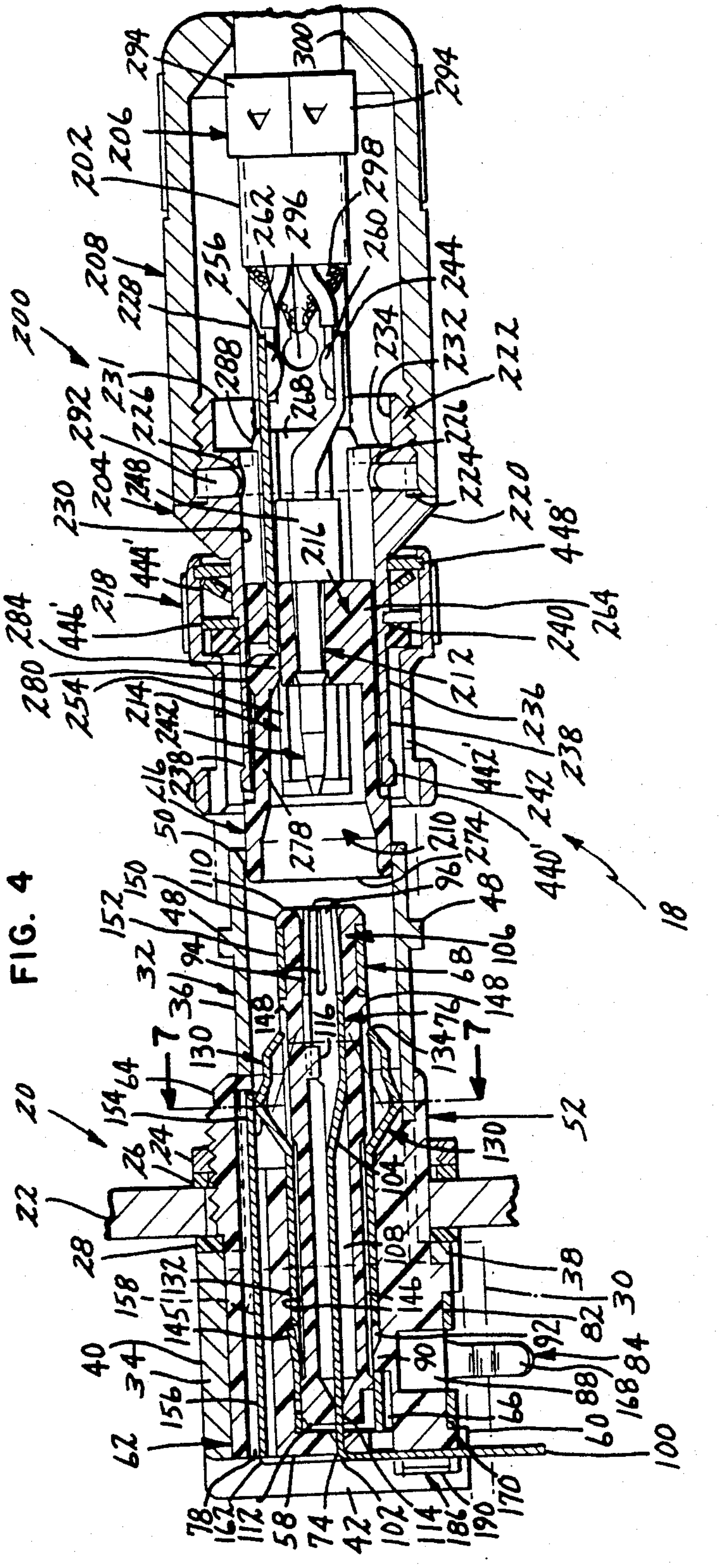
FIG. 4 is a cross-sectional view of the jack and the plug taken along line 4—4 of FIG. 2.

Considering firstly jack 20, attention is directed to FIG. 4. Jack 20 has a housing 32 which includes a shell 34 and a barrel 36. In the preferred embodiment, housing 32 is conductive. Shell 34 is generally rectangular and has a front wall 38, a top wall 40 and a pair of opposite side walls 42 and 44 (see also FIG. 3). Barrel 36 depends from front wall 38 and is approximately centered on it. Barrel 36 is preferably cylindrical about an axis 46 (see FIG. 1). Barrel 36 has a pair of protrusions 48 spaced back a short distance from its open end 50. Protrusions 48 are opposite one another at the top and bottom and extend outwardly from barrel 36. Protrusions 48 cooperate with bayonet locking assembly 218 to lock jack 20 to plug 200.

Figure 2:
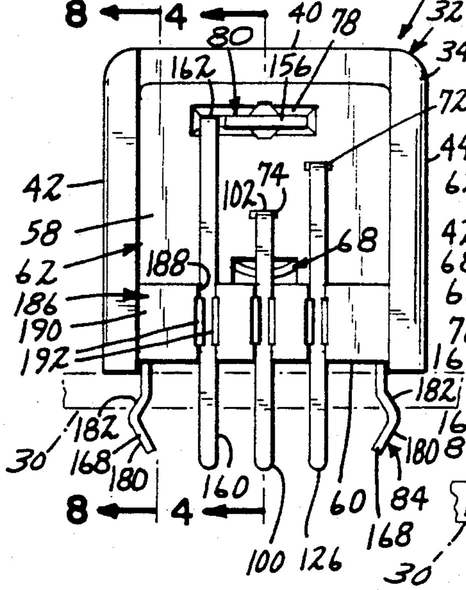
FIG. 2 is an elevational view of the back wall of the jack of FIG. 1 as seen from the line 202 of FIG. 4.

An insulating support 52 is formed within shell 34 and partially in and out of barrel 36. Support 52 is formed by injection molding through a pair of openings 54 and 56 (see FIG. 5) in barrel 36 just forward of front wall 38 of shell 34. Support 52 forms the back wall 58 and the bottom wall 60 (see FIG. 2) of base 62, wherein base 62 comprises the rectangular portion of housing 32 defined by shell 34, back wall 58 and bottom wall 60. The portion 64 of support 52 outside of barrel 36 is threaded to receive nut 24 so as to hold jack 20 with respect to panel 22.

Support 52 includes a central cavity 66 for receiving first conductor 68. A slot 70 (see FIG. 3) having an upper side tangent with the uppermost portion of cavity 66 extends sidewardly to nearly barrel 36. Near the outermost portion of slot 70 a first passage 72 (see FIG. 2) continues through support 52 in a direction generally parallel to axis 46. Passage 72 receives lead 126 of first conductor 68 as discussed hereinafter. Support 52 also includes a second passage 74 very near axis 46 and parallel to axis 46 extending through support 52 to back wall 58. Second passage 74 receives second lead 100 of second conductor 76 as discussed hereinafter. Near the top of barrel 36, a third passage 78, substantially rectangular, extends approximately parallel with axis 46 through support 52 in order to provide a cavity for third conductor 80 having third lead 160 as discussed hereinafter.

As shown in FIG. 3, bottom wall 60 includes a recessed portion 82 extending between side walls 42 and 44 at a depth sufficient to receive grounding clip 84. In addition, recessed portions 86 are formed in the sides of support 52 in order to receive the sides 164 of ground clip 84 between support 52 and side walls 42 and 44. A centrally located cavity 88 in bottom wall 60 is available to receive a retention screw (not shown). In addition, a protrusion 90 (see FIG. 4) extends above cavity 88 to fit into an opening 92 in first conductor 68 to help retain first conductor 68 in cavity 66 of support 52.

Second conductor 76 is the conductor which is most centrally located with respect to barrel 36 and axis 46. Second conductor 76 is formed from an elongated flat sheet. One end is rolled into a substantially cylindrical shape and includes a plurality of slots 94. Slots 94 separate a plurality of fingers 96 which together form a contactor portion 98 for receiving probe 242 of plug 200. At the other end of second conductor 76 is a long, flat second lead 100. Lead 100 passes through second passage 74 and is bent in substantially a right angle at bend 102 so that the end portion of lead 100 extends downwardly along back wall 58 and beneath bottom wall 60 for insertion through circuit board 30. A frame portion 104 separates contactor portion 98 from lead 100.

An insulator 106 separates first and second conductors 68 and 76. Insulator 106 is generally cylindrical for being received by generally cylindrical first conductor 68. Insulator 106 has a cylindrical cavity 108 aligned with axis 46 extending from the front end 110 to near the back end 112. A rectangular passage 114 passes through back end 112 from cavity 108 to provide an opening for lead 100. A protrusion 116 extends into cavity 108 to be received by a slotted portion 118 (see FIG. 3) of second conductor 76 to maintain, in conjunction with rectangular passage 114, the alignment of second conductor 76 with respect to insulator 106.

Figure 5:
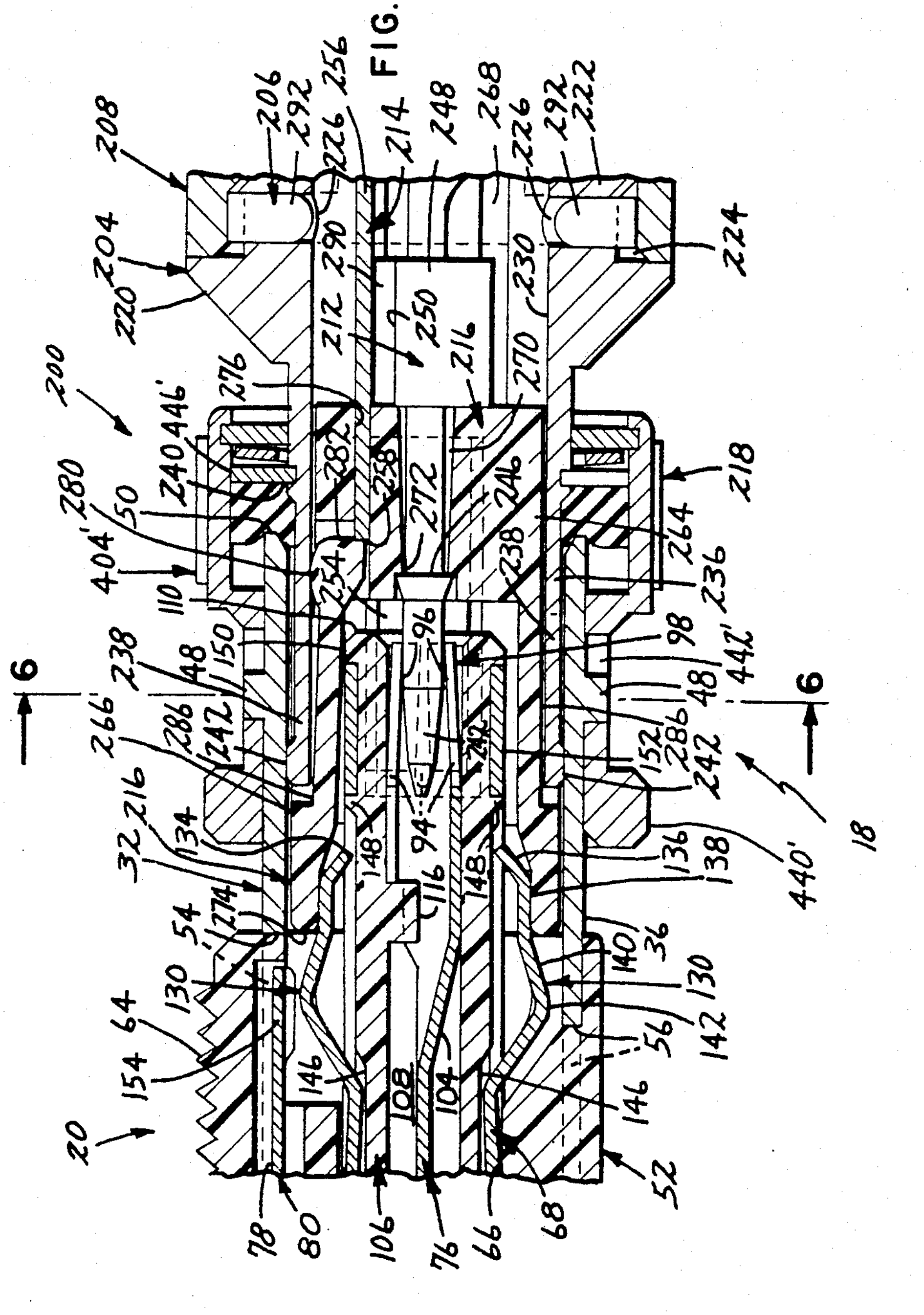
FIG. 5 is an enlarged, cross-sectional view, similar to FIG. 4, showing the jack and the plug connected together.
Figure 7:
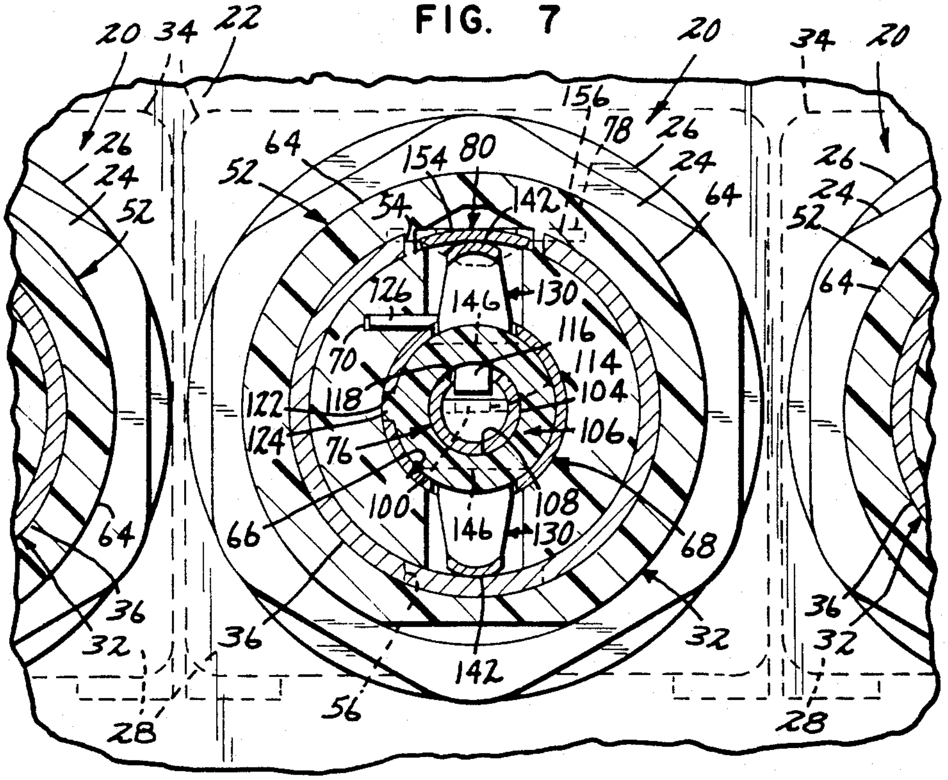
FIG. 7 is a cross-sectional view of the jack taken along line 7—7 of FIG. 4, showing a plurality of side-by-side jacks attached to the panel.

First conductor 68 is a sheet of material formed into a generally cylindrical shape. As shown in FIG. 7, the mating edges of first conductor 68 are separated and at the front end form a slot 122 in which to receive a protrusion 124 formed on the side wall of insulator 106 near front end 110 of insulator 106. First lead 126 extends from the back end 128 of first conductor 68 and does so from a portion canti-levered sidewardly from a tangential point near the top of first conductor 68. Lead 126 extends through passage 72 when first conductor 68 is fitted in cavity 66. As shown in FIGS. 4, 5 and 7, first conductor 68 includes a pair of spring contactors 130. Contactors 130 are generally centered on a vertical plane through axis 46. Each contactor 130 is formed as a leaf spring attached to the frame portion 132 toward the back end of frame portion 132 of first conductor 68. Each contactor 130 near its unattached end 134 has an outwardly inclined ramp 136 ending in an approximately axially-parallel portion 138 which mates with a further outwardly inclined portion 140 peaking at apex 142 before inclining back toward the cylindrical frame portion of first conductor 68. Ramps 136 function to receive the end 274 of sleeve 216 of plug 200 and allow end 274 to easily depress leaf spring contactors 130. Plug 200 is normally inserted so that the end 274 of sleeve 216 rests on parallel portions 138. Each apex 142 is preferably curved, as shown in FIG. 7, so as to make a single contact point with either third conductor 80 or barrel 36. First conductor 68 further includes opening 92 for receiving protrusion 90. First conductor 68 also includes one or more barbs 145. Both function to prevent the pulling of first conductor 68 from cavity 66 of support 52.

Insulator 106 includes detent portions 146 in its outer surface in regions beneath spring contactors 130 so as to allow spring contactors 130 to be depressed. Axially inline with detent portions 146 toward front end 110 of insulator 106, barriers 148 protrude outwardly from the cylindrical surface of insulator 106. Insulator 106 at front end 110 further includes an outwardly extending collar 150. First contactor portion 152 of first conductor 68 is generally cylindrical and is located between barriers 148 and collar 150 with respect to insulator 106. Barriers 148 fit behind first contactor portion 152 in spaces vacated by spring contactors 130 since they are compressed backwardly due to the previously indicated outward bends. Thus, while second conductor 76 is retained in insulator 106 by bend 102, insulator 106 is retained with respect to first conductor 68 by barriers 148 and collar 150. Furthermore, first conductor 68 is retained in support 52 by protrusion 90 in opening 92 and by barbs 145.

Third conductor 80 is formed from a flat sheet and includes a curved or arcuate contactor portion 154 (see FIG. 7) connected to a frame portion 156 (see FIG. 4) having one or more barbs 158 and a third lead 160 extending rearwardly from frame portion 156. Lead 160 extends through slot 78 and is bent at bend 162 to extend downwardly along back wall 58 and beneath bottom wall 60. As shown in FIG. 7, contactor portion 154 has a greater radius of curvature than apex 142 of spring contactor 130. The apex 142 of one spring contactor 130 is normally in contact with contactor portion 154 of third conductor 80. The apex 142 of the other spring contactor 130 is normally in contact with barrel 36. As discussed hereinafter, since barrel 36 is normally grounded, first conductor 68 and third conductor 80 are also normally grounded.

Figure 8:
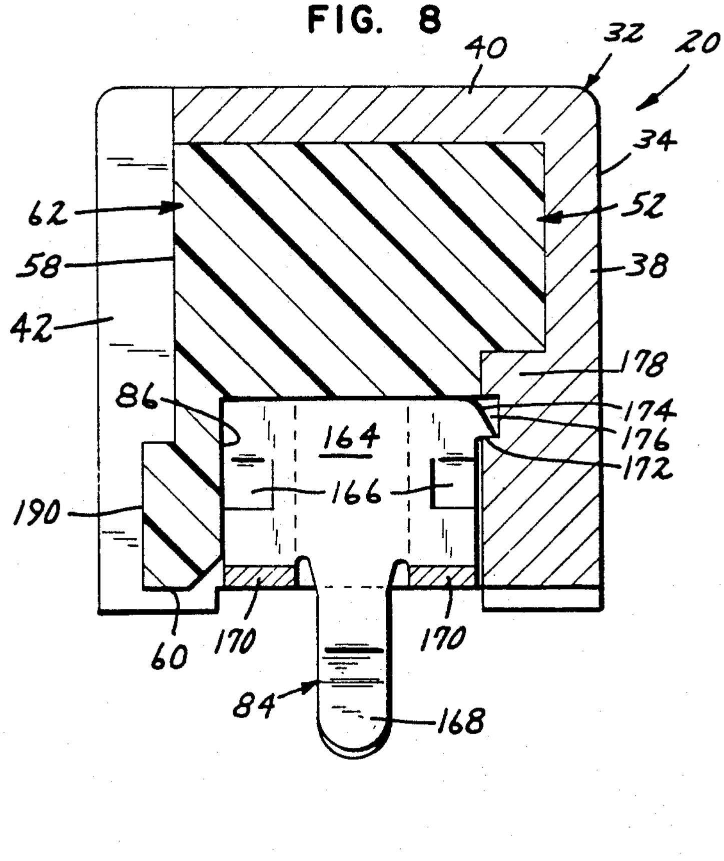
FIG. 8 is a cross-sectional view of the jack taken along line 8—8 of FIG. 2.

As indicated hereinbefore, ground clip 84 (see FIG. 8) is fitted into recess 60 and slots 86 in insulating support 52. Ground clip 84 has a pair of opposite sides 164 for fitting in slots 86. Each side 164 includes one or more barbs 166 for applying a spring force between sides 164 and sides 42 and 44 of shell 34. Since clip 84 is formed from a sheet, legs 168 extend downwardly from sides 164 thereby leaving an open region between a pair of bridge members 170 extending between walls 164. At the top forward edge of each of sides 164, there is an outwardly extending shoulder 172 with a rounded top 174 which fits into a groove 176 in a thicker portion 178 of side walls 42 and 44 and secures clip 84 to base 62.

As shown in FIG. 3, legs 168 of clip 84 68 include an outwardly extending ramp portion 180 at the ends with a connecting inwardly extending inclined portion 182 thereafter. Ramp 180 provides for easy insertion in circuit board 30, while inclined portion 182 contacts the lower edge of the opening 184 in circuit board 30 through which legs 168 are inserted. Since legs 168 are leaf springs, the outward bias at the contact of inclined portion 182 and the edge of opening 184 holds jack 20 to circuit board 30 so that jack 20 is secure to circuit board 30 and the various leads can be flow soldered.

First, second and third conductors 68, 76 and 80, housing 34 including shell 40 and barrel 36, and ground clip 84 are normally made from a conductive material. Thus, since clip 84 is normally grounded, shell 40 and barrel 36 are also normally grounded. Furthermore, as indicated previously, first and third conductors 68 and 80 are normally grounded through spring contactors 130. It is apparent, however, and discussed in more detail hereinafter, that spring contactors 130 in conjunction with barrel 36 and contactor portion 154 of third conductor 80 are switching mechanisms functionable by the end 274 of sleeve 216 of plug 200.

With respect to the assembly of jack 20, consider first the subassembly of first and second conductors 68 and 76 and insulator 106. Second conductor 76 is inserted from front to rear into the central cavty 108 of insulator 106. Second conductor 76 is aligned so that flat lead 100 passes through passage 114 at the end of insulator 106 and so that protrusion 116 is received in slot 118 of second conductor 76. Next, insulator 106 is slid into first conductor 68. Insulator 106 is aligned so that protrusion 124 which extends rearwardly from collar 150 is received by slot 122 which opens to the forward end of first conductor 68. Insulator 106 is inserted until barriers 148 snap into place in spaces vacated by spring contactors 130 of first conductor 68. In this fashion, contactor portion 152 of first conductor 68 is received between barriers 148 and collar 150 of insulator 106.

Next, the subassembly just discussed, third conductor 80, and grounding clip 84 are installed in no particular order into housing 32 after insulating support 52 has been formed therein. Third conductor 80 is inserted into passage 78 from the back wall 58 toward the front of jack 20. The curved contactor portion 154 is concave inwardly. Third conductor 80 is inserted until forward end of frame portion 156 contacts the forward end of the larger width of passage 78. Barbs 158 resist removal of third conductor 80.

First conductor 68 including insulator 106 and second conductor 76, is inserted into central cavity 66. Passages 72 and 74 receive leads 126 and 100 of first and second conductors 68 and 76, respectively. Second conductor 68 is inserted until protrusion 90 snaps into opening 92 of first conductor 68.

Clip 84 is inserted into the bottom of base 62 such that sides 164 fit into slots 86 and so that shoulders 172 snap into grooves 176 in side walls 42 and 44 of shell 34.

Leads 100, 126 and 160 are then bent downwardly to extend below bottom 60 so that they and legs 168 of ground clip 84 may be inserted into an appropriate hole pattern in a circuit board 30.

Anchoring mechanism 186 includes crimping a wall of a groove 188 in an outwardly extended portion 190 of back wall 58 of support 52. At a location beneath the openings of passages 72, 74 and 78 in back wall 58, outwardly extending portion 190 is formed between opposite sides 42 and 44 of shell 40. Grooves 188 are vertical grooves in portion 190 of sufficient width to receive each of leads 100, 126 and 160 and of sufficient depth so that the leads may be pressed into the grooves and at least one wall of each groove crimped, as at numeral 192, to anchor each of the leads and secure them from moving out of grooves 188 when the leads are inserted through openings in circuit board 30 when jack 20 is mounted on circuit board 30. The prior art with respect to downwardly extending leads near the back of a jack features unsupported leads, apparently so that the leads could be adjusted to low tolerance hole patterns in circuit boards. Perhaps it was further felt with respect to the art that the leads once inserted in the circuit boards were in fact supported by the circuit board and, thus, would be prevented from further bending or shorting. In any case, the anchoring mechanism of the present invention, however, shows a fuller use of injection molding to bring the back wall of insulating support 52 directly to the vertical plane at which the right angle bends in the leads are made. The back wall 58 is then available for supporting the leads down to bottom 60. Furthermore, as indicated, the present inventive anchoring mechanism 186 shows the use of an outwardly extending portion 190 with grooves 188 so that one or both walls of grooves 188 may be crimped so as to cover and better lock and anchor each of the leads. Preferably, outwardly extending portion 190 of back wall 58 extends down to bottom wall 60 so that each of the leads may be anchored with crimps 192 very near bottom 60. In this way, the leads 100, 126 and 160 are held solidly so that a person or machine may easily and rapidly insert jack 20 into a rather tight tolerance hole pattern in circuit board 30.

Figures 9, 10, 11, 12, 13:
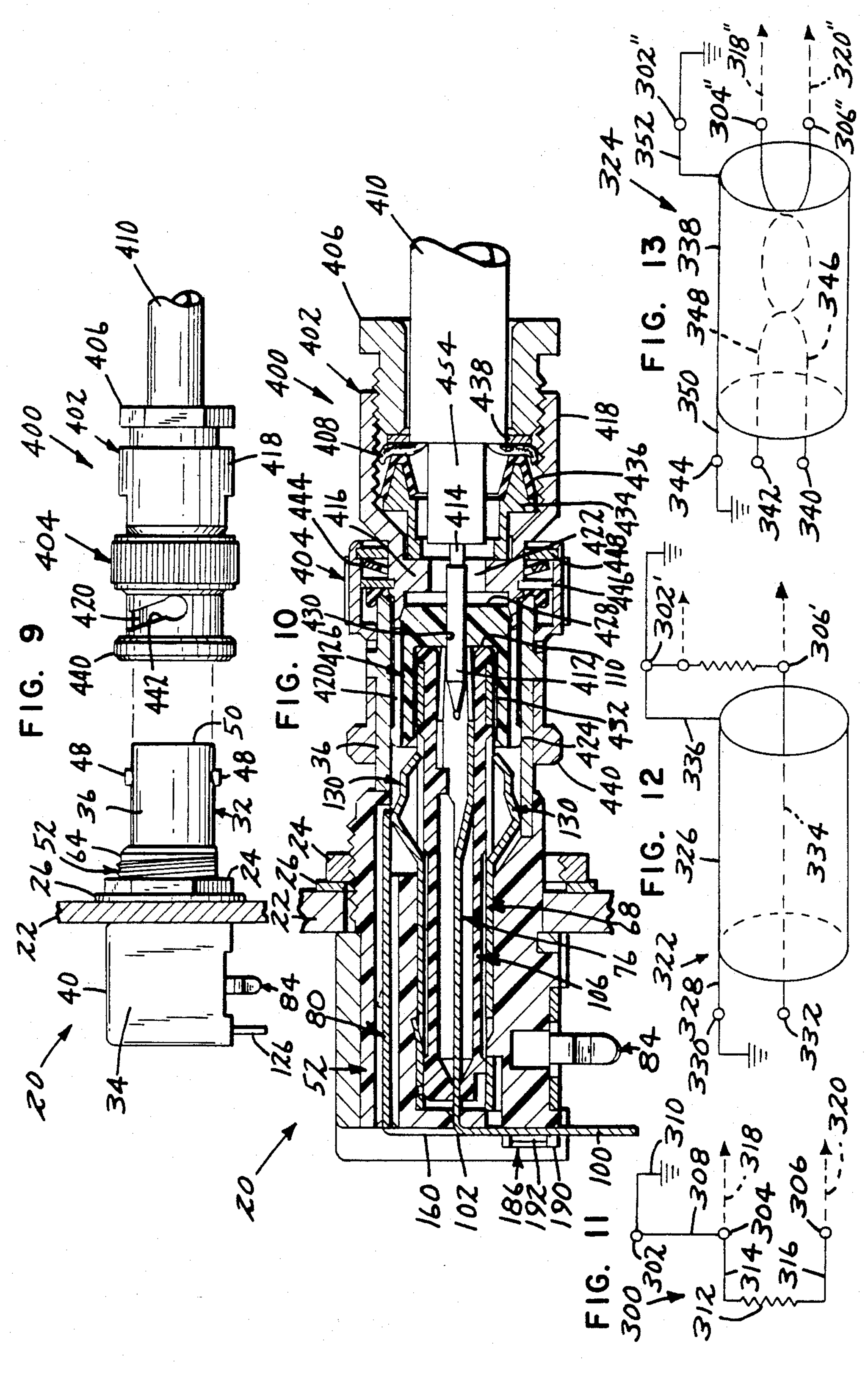
FIG. 9 is a side elevation of the jack of the present invention and of a conventional plug for use with coaxial cable.
FIG. 10 is a cross-sectional view of the jack and plug of FIG. 9 connected together.
FIG. 11 is a schematic diagram of the receiving terminals for the jack of the present invention.
FIG. 12 is a schmatic diagram of the connector apparatus of the type shown in FIGS. 9 and 10 after connected with the receiving terminals as shown in FIG. 11.
FIG. 13 is a schematic diagram of the jack and plug of FIGS. 1-8 after connected to appropriate receiving terminals.

As indicated hereinbefore, jack 20 may be used with a inventive plug 200, as shown in FIGS. 1, 4 and 5, or with a conventional plug 400, as shown in FIGS. 9, 10. Conventional plug 400, as discussed hereinafter, does not function the switching mechanism comprising first conductor 68, third conductor 80 and barrel 36, while special plug 200 does function the switching mechanism.

Plug 400 includes a housing 402 with a bayonet locking mechanism 404 attached thereto. A nut 406 tightens against the shield portion 408 of coaxial cable 410 to hold plug 400 to coaxial cable 410. A cylindrical probe 412 is soldered or otherwise attached to the central conductor 414 of coaxial cable 410.

Housing 402 is generally cylindrical with a central body 416 having a cable receiving end portion 418 on one side and a jack receiving portion 420 on an opposite side. Cable receiving portion 418 has a larger outer diameter than body 416 and is internally threaded to receive nut 406. Body 416 includes an axial passage 422 through which probe 412 extends without touching the sides of passage 422. Jack receiving portion 420 of housing 402 is generally cylindrical and often includes a plurality of axial slots so that the cylindrical walls may compress. Portion 420 has a diameter which allows the end collar 424 of portion 420 to form an interference fit within barrel 36 or a conventional jack having a receiving end similar to barrel 36 of jack 20. An insulator 426 is fitted within portion 420 and extends to body 416. Insulator 426 has a base 428 with an axial passage 430 for receiving probe 416. The end of insulator 426 includes a cylindrical cavity 432 for receiving and 110 of insulator 106 or a similar member in a conventional jack. Insulator 426 does not protrude from jack receiving portion 420 of housing 402 and, consequently, is unable to function the switching mechanism of jack 20.

Cable receiving portion 418 of housing 402 includes an insert 434 and a gasket 436. Nut 406 pinches shield 408 between washer 438 and gasket 436 to secure the shield and, consequently, cable 410 to plug 400. Since washer 438, nut 406 and housing 402 are normally conductive, the electrical ground of shield 408 is preserved through to barrel 36 of jack 20.

A bayonet locking mechanism 404 holds plug 400 to jack 20. Mechanism 404 includes a shell 440 having a camming slot 442 for receiving protrusions 48 on barrel 36 of jack 20. Protrusions 48 are forced against camming slot 442 by a spring washer 444 held between a side washer 446 snapped in place about body 416 of housing 402 and a side washer 448 snapped into the wall of shell 440.

Thus, with the conventional plug 400, a ground path is maintained, as indicated, through sheild 408, washer 438, nut 406, housing 402 to barrel 36. In addition, washers 446 and 448 and shell 440 are normally conductive so they are also grounded. The electrical conduction path of the central conductor 414 of coaxial cable 410 is maintained through probe 430 which makes contact with second conductr 76 of jack 20. Insulator 426 supports probe 414 and separates it from the grounded elements.

With respect to the new plug, as shown in FIGS. 4 and 5, Special plug 200 includes a housing 204 to which a cable retainer 206 is connected, as is a cover 208. Plug 200 further includes an assembly 210 for fitting within housing 204 which includes first and second conductors 212 and 214 separated by insulator 216. A bayonet locking assembly 218, the same as assembly 404 of conventional plug 400 is attached to housing 204.

The insulator 216 of plug 200 extends beyond housing 204 and bayonet locking assembly 218. In this way, insulator 216 extends into barrel 36 to contact spring contactors 130 when plug 200 is received by jack 20. Insulator 216 opens the switching contact between contactors 130 and barrel 36 and third conductor 80. At the same time as insulator 216 is inserted to function the switching mechanism, first and second conductors 212 and 214 are slid into contact with the second and first conductors 76 and 68 of jack 20. The ground electrical connection is maintained between plug 200 and jack 20 through contact of housing 204 and barrel 36, as well as through bayonet locking assembly 218 and barrel 36.

As indicated previously, many of the details of plug 200 were invented by a design team of inventors who worked on jack 20 and claims directed to their invention are made in an application filed the same day as the present application and assigned to the assignee of the present application. Much of the discussion hereafter is, therefore, claimed in that application.

Housing 204 has a frusto-conical central portion 220. Extending rearwardly from the base of conical portion 220 is an externally threaded, cylindrical portion 222. The threads are spaced from the base by a circumferential groove 224. A pair of radial openings 226 are located in groove 224 and are located approximately on opposite sides of cylindrical portion 222. Halfway between openings 226 on one side of cylindrical portion 222, a flat cutaway (not shown) exists in cylindrical portion 222. Such cutaway portion provides for connecting bridge 228 of retainer 206 such that bridge 228 does not interfere with the threading of cover 208 to housing 204 as discussed hereinafter.

A cylindrical passage 230 extends completely through housing 220 and defines the axis 46 of plug 200 for alignment with jack 20. At the back end 231 of housing 204 and beneath a portion of threaded portion 222, passage 230 is enlarged, as at 232, so as to form a radial shoulder 234 between the two different diameter portions of the passage.

Figure 6:
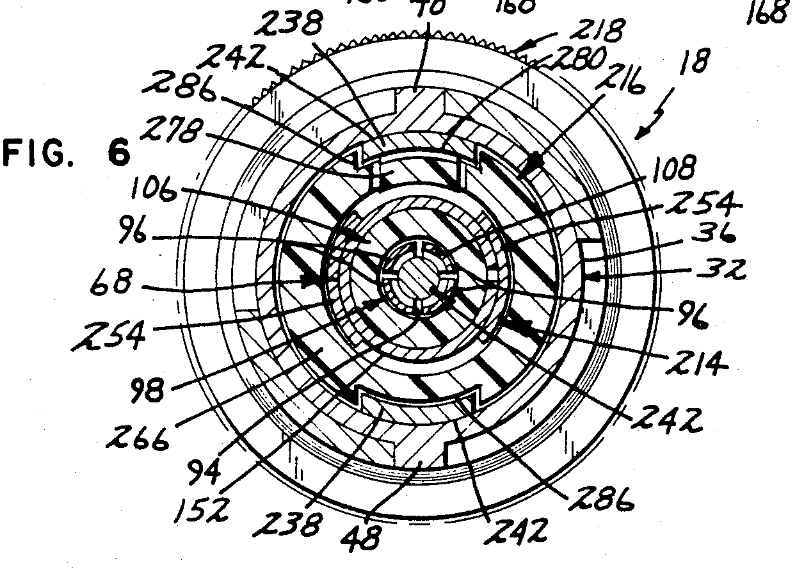
FIG. 6 is a cross-sectional view of the interconnected jack and plug as taken along line 6—6 of FIG. 5.

Extending forwardly from frusto-conical portion 220 is a cylindrical sleeve 236. As shown in FIG. 6, opposite sides of sleeve 236 are cut away for about half its length so as to define legs 238. Using the same numerals for bayonet locking assembly 218, only primed, as were used with respect to bayonet locking assembly 404 of plug 400, cylindrical sleeve 236 includes circumferential slot 240 for receiving washer 446' of bayonet locking assembly 218. Legs 238 have an outwardly extending collar 242 at the ends. The region between collar 242 and just before circumferential slot 240 is recessed so as not to create an unnecessary amount of friction with barrel 36 when plug 200 is received by jack 20.

As indicated previously, assembly 210 includes first and second conductors 212 and 214 and insulator 216. First conductor 212 includes probe contactor 242 at a first end and a first terminal 244 at a second end. Probe 242 includes a shoulder 246 extending circumferentially outwardly from probe 242. About halfway between shoulder 242 and first terminal 244 is a gland 248. Gland 248 is a cylindrical enlargement of a portion of the shaft of probe 242 and has along one side a planar wall 250. Wall 250 is approximately parallel with flat terminal 244 and is spaced from the center of probe 242. Shoulder 246 is approximately halfway between the forward edge of gland 248 and tip 252 of probe 242.

Second conductor 214 has a pair of spaced apart contactor members 254 extending in the forward direction and a terminal member 256 extending in the rearward direction. Contactor members 254 are curved with a radius of curvature approximately equal to an imaginary cylinder of which they are a part (see FIG. 6). Contactor members 254 are held apart by the width of terminal member 256. The forwardmost end of terminal member 256 forms an edge 258 extending between contactor members 254. Contactor members 254 are approximately one third the length of terminal member 256. Second conductor 214 is approximately the same length as first conductor 212. First and second conductors 212 and 214 terminate at approximately the forward end of housing 204 and extend somewhat beyond the rearend of housing 204. Each of terminals 244 and 256 include openings (not shown) near the ends for easy wire insertion and soldering, as at 260 and 262 in FIG. 4.

Insulator 216 is generally cylindrical and is formed to be received in passage 230 of housing 204. Insulator 216 is formed to have a central body 262 with a cylindrical sleeve 266 extending from one end of body 264 and a pair of opposing arms 268, one of which is seen in FIGS. 4, 5, extending from the other end. Body 264 includes an axial passage 270 for receiving probe 242. At the forward end of passage 270, there is a radial edge 272 for engaging shoulder 246 of probe 242.

Sleeve 266 has a slightly larger outer diameter than body 264. The sleeve diameter is only slightly smaller than the inside diameter of barrel 36 of jack 20. The inside diameter of sleeve 266 near open end 274 is sized to compress spring contactors 130 away from contact with barrel 36 and contact portion 154 of third conductor 80 when the end portion of sleeve 266 is fitted on spring contactors 130 at portions 138. End 274 is curved so as to ride easily along ramp surface 136.

In the mating region of sleeve 266 and body 264 on the inside of sleeve 266 there is a groove (not shown) in body 264 approximately three-fourths around the circumference of the inside diameter of sleeve 266. The groove extends more than halfway through body 264 and is shaped to receive second conductor 214 in the region where contactors 254 are connected with terminal member 256. In addition, the rectangular passage 276 extends all the way through body 264 for the purpose of receiving terminal member 256. Thus, second conductor 214 fits within the groove when terminal member 256 extends through passage 276. The portion of second conductor 214 which fits in the groove (not shown) is illustrated by dotted lines in FIG. 5. The unattached ends of contactors 254 extend into the cavity of sleeve 266 so as to contact and mate with contactor portion 152 of first conductor 68 of jack 20 (see FIG. 6).

Sleeve 266 includes an arm 278 cutaway on three sides from sleeve 266, but attached near the forward portion of sleeve 266. Arm 278 depends rearwardly and includes an upraised cam portion 280 on the outer side at the rear end 282 and at the same end also includes an inwardly enlarged portion 284 (see FIG. 4). When cam 280 results in arm 278 being depressed by the wall of passage 230, end edge 282 of arm 278 is located so as to contact edge 258 of second conductor 214 thereby locking second conductor 214 to insulator 216.

As shown in FIG. 6, the outer diameter of sleeve 266 has a pair of recessed portions 286 extending forwardly from body 264 to near the forward end portion of sleeve 266. One of the recessed portions 286 is centered on arm 278. Recessed portions 286 receive arms 238 of housing 204 which prevent insulator 216 from rotating with respect to housing 204.

Arms 268 extend rearwardly from body 264. Arms 268 have radially outwardly extending collars 288 at the ends of arms 268, one of which is seen in FIG. 4. Collars 288 engage edge 234 of housing 204 to hold insulator 216 securely in housing 204. A split planar wall 290 has portions extending from each arm 268 toward the other with a central separation (not shown). Split wall 290 separates terminal member 256 of second conductor 214 from the planar wall 250 of gland 248 of first conductor 212.

Assembly 210 may be machine or hand assembled and fits together in an interlocking fashion such that a last assembled piece holds all previously assembled pieces in place. Firstly, first connector 212 is inserted from the back of insulator 216 toward the front. Probe 242 is inserted through the central passage 230 in body 264. First conductor 212 is oriented so that planar wall 250 of gland 248 is adjacent to split planar wall 290. First conductor 212 is inserted until shoulder 246 engages radial edge 272. The engaging of shoulder 246 with edge 272 prevents retraction of first conductor 212 while the abutment of wall 250 with split wall 290 prevents rotation of first conductor 212 with respect to insulator 216.

Then, second connector 214 is inserted from the front end of insulator 216 toward the rear end. Terminal member 256 is passed through passage 276, and contactor members 254 are pressed into the curved slot in the front of body 264.

Insulator 216 is then inserted from front to rear into housing 204. Because of collars 288, arms 268 are compressed by wall 230 so that insulator 216 may be slid through passage 230. As insulator 216 is slid through, cam 280 is depressed to flex arm 278 inwardly so that edges 258 and 282 engage thereby locking second conductor 214 to insulator 216. Insulator 216 is oriented so that arms 238 fit within recessed areas 286 of insulator 216. Insulator 216 is slid into passage 230 until arms 268 flex outwardly whereby collars 288 engage radial edge 234. The engagement of collars 288 with edge 234 prevents insulator 216 from moving forwardly, while arms 238 in recesses 286 prevent insulator 216 from moving rearwardly or rotationally with respect to housing 204.

Cable retainer 206 is attached to the circumferential groove 224 having openings 226 therein. Cable retainer 206 includes a semi-cylindrical strap, (shown by dotted lines in FIGS. 4, 5) having legs 292 at the ends thereof. Legs 292 are inserted in openings 226. Connecting bridge 228 is connected at one end to the strap, while curved members 294 are attached at the other end. Curb members 294 curve upwardly from connecting bridge 228 to partially surround axis 46. Curved member 294 are crimped onto cable 202 to hold it so as to relieve tension on solder joints 260 and 262. Connecting bridge 228 includes an opening 296 which is larger at the forward end to allow for both easy insertion, of the end of cable shield 298 and, once inserted, a retaining pinching action on cable shield 298.

Cover 208 is cylindrically shaped with one end open and the other end closed except for an opening 300 to allow for passage therethrough of cable 202. Cover 208 has an internal threading at the open end so as to thread onto housing 204 at portion 222. Cover 208 provides a covering between housing 204 and cable 202 to protect the ground and other conductive connections.

As indicated previously, a bayonet locking assembly 218 exactly the same as assembly 404 is used on plug 200 to lock plug 200 with respect to barrel 36, utilizing protrusions 48 in exactly the same fashion as previously described with respect to plug 400.

The present invention provides an electrical connection between a coaxial cable or a shielded, twisted pair cable and a circuit board. In FIG. 11, a circuit 300 with receiving terminals for jack 20 is schematically illustrated. Circuit 300 has a ground terminal 302 and first and second receiving terminals 304 and 306. Terminal 304 is connected through line 308 to terminal 302 which is connected to ground via line 310. Terminals 304 and 306 are maintained at different potential levels due to resistor 312 connected to terminal 304 via line 314 and to terminal 306 via line 316. Dotted lines 318 and 320 extending from terminals 304 and 306, respectively, illustrate connections to further circuitry which is unimportant to the present invention.

Circuit 322, shown in FIG. 12, illustrates schematically the electrical connction of a coaxial cable 410 through a conventional plug 400 and inventive jack 20 to a circuit like that of FIG. 11. Similarly, FIG. 13 shows circuit 324 which schematicaly illustrates the connection between a shielded, twisted pair cable through plug 200 and jack 20 to a circuit like that shown in FIG. 11, less resistor 312. Elements in FIGS. 12 and 13 which are similar to the elements in FIG. 11 are designated with identical numerals only are single or double primed for the sake of clarity.

Circuit 322 shows the combination of plug 400 and jack 20 as conenctor 326. The ground shield of cable 410 is connected to connector 310 via line 328 at terminal 330. The other conductor is connected at terminal 332 via line 334 through connector 326 to terminal 306'. The ground is maintained with connector 326 via line 336 to ground terminal 302'.

In circuit 324, connector 18 of FIG. 1 comprising jack 20 and plug 200 is designated by the numeral 338. First and second conductors of the twisted pair are connected to connector 338 at terminals 340 and 342, respectively. The grounded shield is connected to terminal 344. The first and second conductors maintain continuity through connector 338 to terminals 306'' and 304'' through lines 346 and 348. Grounded terminal 344 maintains the ground with connector 338 and ground terminal 302'' via lines 350 and 352. Although the circuit represented by dotted lines 318'' and 320'' may include a resistor across terminals 304'' and 306'', such resistor may not be desirable, and, consequently, is not shown.

In use, conventional plug 400, coaxial cable 410 is connected to plug 400 by soldering or otherwise attaching probe 412 to conductor 414. The cable insulator 454 insulates conductor 414 from ground shield 408. Ground shield 408 is spread sidewardly and fastened between gasket 436 and washer 438 when nut 406 is threaded tightly into threaded portion 418 of housing 402. Plug 400 may then be connected to jack 20 simply by aligning protuberances 48 with slots 442 and turning shell 440 to compress spring 444. Such connection is schematically illustrated in FIG. 12 when jack 20 is appropriately mounted on a circuit board.

Jack 20 is mounted on a circuit board 30 by aligning leads 100, 126 and 160, as well as ground legs 168 with appropriate openings in the circuit board and pressing. Legs 168 deflect and then draw jack 20 to circuit board 30 as they spring into place. Legs 168 hold jack 20 to circuit board 30 so that the circuit board may be reoriented and an appropriate soldering technique used to make electrical connections to the leads and, if desired, the legs.

Jack 20 is also often attached to a panel 22. Panel 22 has an appropriately sized opening for easily receiving threaded portion 64 of support 52 on barrel 36. If it is desired to insulate jack 20 from panel 22, an insulating washer 28 is inserted onto threaded portion 64 before panel 22 and jack 20 are brought together. Thereafter, a washer 26 and nut 24 are turned onto threaded portion 64 to tighten jack 20 to panel 22. It is noted that by choosing appropriately sized washers and nuts, that the rectangular shape of shell 34 allows side by side placement of a plurality of jacks on a circuit board and mounted to a panel, as shown in FIG. 7.

With respect to plug 200, legs 292 of retainer 206 are snapped into place in openins 226 of housing 204. Shielded, twisted pair cable 202 is connected so that the appropriate wires are soldered or otherwise attached to first and second conductors 214 and 212 at terminal 256 and 244, respectively. Shield 298 is threaded into opening 296 and pulled rearward into the narrower part of the opening. It, too, may be soldered. Members 294 of retainer 206 are then crimped onto cable 202 to relieve any strain on the solder connections. Cover 208 is slid down cable 202 and threaded onto housing 204 at threaded portion 222 so as to cover the solder connections. Plug 200 is then inserted into jack 20. The end 274 of insulator 216 is inserted into barrel 36 so that end 274 moves between spring contactors 130 and barrel 36 on one side and spring contactor 130 and third conductor 80 on the other side. At the same time, first and second plug conductors 112 and 114 are slid into contact with second and first jack conductors 76 and 68, respectively. Ground connection is maintained between housing 204 and barrel 36 either at collar 242 or through the connection of bayonet locking assembly 218 with barrel 36. Bayonet locking assembly 218 is functioned in the same fashion as indicated with plug 400, i.e., by aligning protrusions 48 with the appropriate slots and turning the shell to compress the spring.

Either plug 200 or plug 400 is removed from jack 20 simply by turning shell 404 to release the compression of spring 444 and allow protrusions 48 to follow slots 442 and be released from shell 404.

Thus, various structural features and details of assembly and function of both jack 20 and plug 200 have been pointed out throughout the specification. Of particular advantage is the utility of jack 20 for connecting not only a coaxial cable with a conventional plug to a circuit board, but also of connecting a shielded, twisted pair cable through plug 200 to a circuit board. Such versitility is possible in part because of the unique switching mechanism ofjack 20. The present connector apparatus also embodies additional advantageous and unique features, including the anchoring mechansm for leads 100, 126 and 160 of jack 20 and the assembly and interlocking arrangement of the various parts of plug 200 and of jack 20. Even though, however, these and other features have been pointed out and described with particularity with respect to a preferred embodiment, it is understood that there may be equivalent structures and methods. Consequently, the embodiment of the present specification is understood to be illustrative. For this reason, changes made, especially in matters of shape, size, arrangement and combination of components and assemblies, to the full extent extended by the general meaning of the terms in which the appended claims are expressed, are within the principle of the invention of the present connector apparatus.

What is claimed is:

1. A jack for mounting on a circuit board, said jack for receiving a plug, said jack comprising:

a housing having a base and a barrel, said base having front and back walls and a bottom wall therebetween, said barrel extending from said front wall;

first and second means for conducting electricity, said first and second conducting means extending to said barrel for connection to said plug when said jack receives said plug, said first and second conducting means including first and second leads, respectively, said first and second leads having portions extending along the back wall of said base;

means for insulating said first and second conducting means from each other, said insulating means including a molded dielectric member, said dielectric member forming at least a part of the back wall of said housing; and means for anchoring said first and second leads, said anchoring means including first and second grooves in the back wall part of said dielectric member for receiving said first and second leads, said anchoring means further including first and second crimped portions of said dielectric member to at least partially cover said first and second leads in said first and second grooves to prevent said first and second leads from moving from said first and second grooves;

whereby said anchoring means stiffens said leads near the bottom wall of the base for ease in mounting to said circuit board.

2. A method of making an electrical jack, said jack having a housing, said housing having a back wall with first and second passages therethrough and first and second grooves therein, said jack further having first and second means for conducting electricity, said first and second conducting means including first and second leads, said jack also having means for insulating said first and second conducting means from each other, said method comprising the steps of:

extending said first and second leads through said first and second passges;

bending said first and second leads;

fitting said first and second leads into said first and second grooves; and crimping a wall of each of said first and second grooves toward an opposite wall to hold said first and second leads in said first and second grooves.

* * * * *

UNITED STATES PATENT AND TRADEMARK OFFICE

CERTIFICATE OF CORRECTION

PATENT NO. : 4,609,242

DATED : September 2, 1986

INVENTOR(S) : Nels E. Kemppainen

It is certified that error appears in the above-identified patent and that said Letters Patent is hereby corrected as shown below:

Column 2, line 12, "hve" should be --have--.

Column 2, lines 16-17, "inventions" should be --invention--.

Column 4, line 53, delete "inline" and insert therefor --in line--.

Column 7, line 53, "conductr" should be --conductor--.

Column 9, line 15, delete "262" and insert therefor --264--.

Column 12, line 51, delete "ofjack" and insert --of jack--.

Column 14, line 17, (claim 2, line 11) "passges" should be --passages--.

Signed and Sealed this

Twentieth Day of January, 1987

*Attest:*

DONALD J. QUIGG

*Attesting Officer*

*Commissioner of Patents and Trademarks*